(12) United States Patent
Phan et al.

(10) Patent No.: US 6,613,500 B1
(45) Date of Patent: Sep. 2, 2003

(54) REDUCING RESIST RESIDUE DEFECTS IN OPEN AREA ON PATTERNED WAFER USING TRIM MASK

(75) Inventors: Khoi A. Phan, San Jose, CA (US); Bhanwar Singh, Morgan Hill, CA (US); Ramkumar Subramanian, San Jose, CA (US); Michael K. Templeton, Atherton, CA (US); Jeff Erhardt, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 73 days.

(21) Appl. No.: 09/824,079

(22) Filed: Apr. 2, 2001

(51) Int. Cl.7 .............................. G03F 7/00; G03F 7/20; G03F 9/00
(52) U.S. Cl. ..................... 430/394; 430/30; 430/312; 430/322
(58) Field of Search ................. 430/311, 312, 430/322, 323, 394, 30; 438/14

(56) References Cited

U.S. PATENT DOCUMENTS 5,538,833 A  7/1996 Ferguson et al. .......... 430/325
5,795,685 A * 8/1998 Liebmann et al. ............ 430/5
5,807,649 A  9/1998 Liebmann et al. ............ 430/5
5,919,605 A * 7/1999 Uchiyama .................. 430/312

OTHER PUBLICATIONS

H.Y.Liu et al. "The Application of Alternating Phase–shifting masks to 140nm Gate Patterning", SPIE, 1998, v3334, p 2–14.*

"Understanding The DUV Resist Development Process Using A Develop Residue Monitoring Technique," Christopher L. Pike and Jeff Erhardt, Advanced Micro Devices, Inc., Sunnyvale, California. Published and Presented at Olin Interface '99 Conference, San Diego, California, Oct. 1999.

* cited by examiner

*Primary Examiner*—Mark F. Huff
*Assistant Examiner*—Kripa Sagar
(74) *Attorney, Agent, or Firm*—Amin & Turocy, LLP

(57) ABSTRACT

One aspect of the present invention relates to a method for reducing resist residue defects on a wafer structure. The method involves providing a semiconductor structure having a photoresist, the photoresist comprising open areas and circuit areas thereon; irradiating the open areas and circuit areas through a first photomask with a first energy dose to effect an image-wise pattern in the photoresist; irradiating the open areas of the photoresist through a second photomask with a second energy dose; and developing the photoresist.

22 Claims, 9 Drawing Sheets

REDUCING RESIST RESIDUE DEFECTS IN OPEN AREA ON PATTERNED WAFER USING TRIM MASK

TECHNICAL FIELD

The present invention generally relates to processing a semiconductor substrate. In particular, the present invention relates to reducing post-develop defects present on a photoresist clad wafer.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing densities, smaller and smaller feature sizes are required. Since numerous conductive features are typically present on a semiconductor wafer, the trend toward higher device densities is a notable concern.

The requirement of small features (and close spacing between adjacent features) requires high resolution lithographic processes. In general, lithography refers to processes for pattern transfer between various media. It is a technique used for integrated circuit fabrication in which a silicon slice, the wafer, is coated uniformly with a radiation-sensitive film, the photoresist. The photoresist coated substrate is baked to evaporate any solvent in the photoresist composition and to fix the photoresist coating onto the substrate. The baked coated surface of the substrate is next subjected to selective radiation using a mask; that is, a mask is employed to effect an image-wise exposure to actinic radiation. The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithographic processes include visible light, ultraviolet (UV) light, deep ultraviolet (DUV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist.

Due to the large number of critical masking steps in a modern process flow and the inherent ability to impact pattern fidelity, photolithographic defects are particularly dangerous. The ability to detect and eliminate new defect types becomes increasingly important as integrated circuit device geometries continue to shrink into the deep sub-micron regime. Post-develop residue is a common defect phenomenon particularly in DUV lithography which occurs at a critical mask layer. For example, post-develop defects may occur at an active mask layer on a nitride film and/or at a polysilicon mask on a polysilicon/silicon oxide film or on a silicon nitride BARC (bottom anti-reflective coating) film.

Formation of post-develop or resist residue defects commonly occurs during a pattern image transfer associated with a lithography process. As a result of irradiating a photoresist through a photomask, resist residue or byproducts often form on the photoresist. A developer solution is then deposited over the selectively irradiated photoresist. However, the solubility of the radiation sensitive Photo Acid Generator (PAG) contained in the photoresist can be low. Moreover, it is believed that low solubility rates of the PAG in the developer are exacerbated by the presence of impurities (calcium, sulfur), which cause exposed (open) regions of the resist to be incompletely dissolved in the developer solution within a common process time (typically a 60 to 90 second develop time). As a result, circular defects are generated and remain on the wafer at the completion of the development cycle.

While not wishing to be bound by any theory, it is believed that the solubility rate of the photoresist including the PAG can be enhanced by providing more energy to the photoresist during the inventive lithography process without impacting tiny geometry dimensions. Therefore, as a result of the present invention, resist residues can be substantially, if not completely, dissolved during a standard develop process.

FIGS. 1 and 2 show two common circuit patterns exhibiting this post-develop defect phenomenon. In particular, FIG. 1 illustrates a plan view of a patterned photoresist clad wafer 10. The photoresist 12 has an exemplary layout for a memory device patterned thereon comprising a core circuit 14 and a periphery circuit 18. The circuit patterns 14 and 18 may be formed by a DUV lithography process using a conventional poly gate or circuit mask (not shown). Resist residues (not shown) or resist byproducts of the resist processing are also present on the photoresist before development. After development, post-develop defects 22 undesirably form on the photoresist where they may cause problems. Post-develop defects 22 primarily tend to appear in the open and/or peripheral areas of the wafer 10. However, it should be understood that post-develop defect density and distribution varies with the particular mask layout employed.

Post-develop defects may also be interspersed in the open areas between circuit patterns of a logic device structure. FIG. 2 illustrates a plan view of a patterned photoresist clad wafer 26 for such a device. Following development of the photoresist 28, post-develop defects 34 are primarily detected in the open areas 38 around and/or outside of the circuit patterns 30. With respect to logic device structures, it should be appreciated that defect distribution is layout sensitive (logic device layout) while defect density varies with the logic device mask layout as well as the resist process employed.

If the resist residue (resist byproducts) contains impurities, such as carbon, calcium (such as in the form of CaF), nitrogen and/or sulfur, the defects become robust enough to withstand decay during a subsequent etch process. Hence, poor fidelity of the desired pattern at that layer results (the defects prevent processing of the underlying layer).

Post-develop defects tend to have a circular appearance and thus are typically referred to as circular, satellite or cluster defects. Due to their subtle physical characteristics and low density, these defects are often dismissed as non-fatal defects. However, they may contribute to yield loss and raise device reliability issues because of the sheer volume (hundreds to thousands) of such defects on the wafer. In addition, despite their subtle physical characteristics, they can undesirably act as a hard mask, resulting in pattern deformation after etch. Thus, pattern deformation poses a substantial yield risk. In light of these problems, there is an unmet need for detecting, reducing and controlling the presence of post-develop defects at critical mask layers.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a method for improving wafer sort yield and product reliability by reducing post-develop defects at critical mask layers. More specifically, the present invention provides a method for reducing post-develop defects at critical mask layers by exposing a photoresist through a defect trim mask with a high dose of energy. The present invention involves dissolving all or substantially all resist residues in the open regions outside circuit sensitive areas without substantially any impact on critical dimension control and pattern fidelity of the circuit.

One aspect of the present invention relates to a method for reducing resist residue defects involving providing a semiconductor structure having a photoresist, the photoresist comprising open areas and circuit areas thereon; irradiating the open areas and circuit areas through a first photomask with a first energy dose to effect an image-wise pattern in the photoresist; irradiating the open areas of the photoresist through a second photomask with a second energy dose; and developing the photoresist.

Another aspect of the present invention relates to using a defect trim mask to facilitate a method for reducing resist residue defects. The method involves providing a semiconductor structure having a photoresist with open areas and closed areas thereon; irradiating the open areas and the circuit areas of the photoresist through a photomask with a first energy dose to effect an image-wise pattern in the photoresist; irradiating the open areas of the photoresist through a defect trim mask with a second energy dose; and developing the photoresist.

Yet another aspect of the present invention relates to a method for reducing resist residue defects in open areas peripheral to an image-wise circuit pattern on a wafer structure. The method involves depositing a photoresist layer having open areas and circuit areas over the semiconductor structure; irradiating the open areas and the circuit areas of the photoresist through a poly gate mask with a first energy dose to effect an image-wise pattern in the photoresist; irradiating the open areas of the photoresist through a defect trim mask with a second energy dose, wherein the second energy dose is greater than the first energy dose; and developing the photoresist.

Still yet another aspect of the present invention relates to a system for reducing resist residue defects containing means for providing a semiconductor structure having a photoresist with open areas and circuit areas thereon; means for irradiating the open areas and circuit areas through a first photomask with a first energy dose to effect an image-wise pattern in the photoresist; means for irradiating the open areas of the photoresist through a second photomask with a second energy dose; and means for developing the photoresist.

DISCLOSURE OF INVENTION

Figure 1:
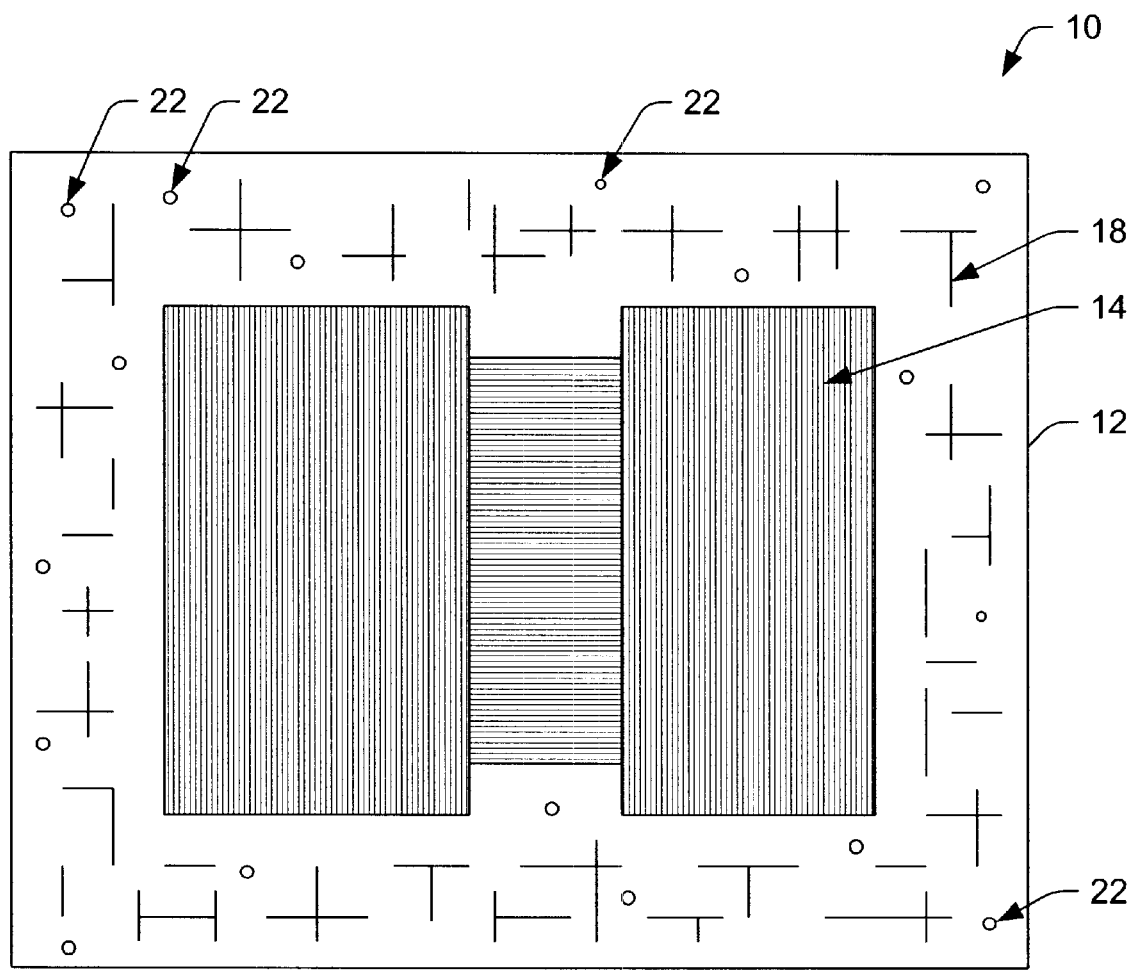
FIG. 1 illustrates a plan view of a photoresist clad wafer patterned by an exemplary mask layout for a memory device demonstrating circular defect distribution on a wafer in accordance with a prior art.
Figure 2:
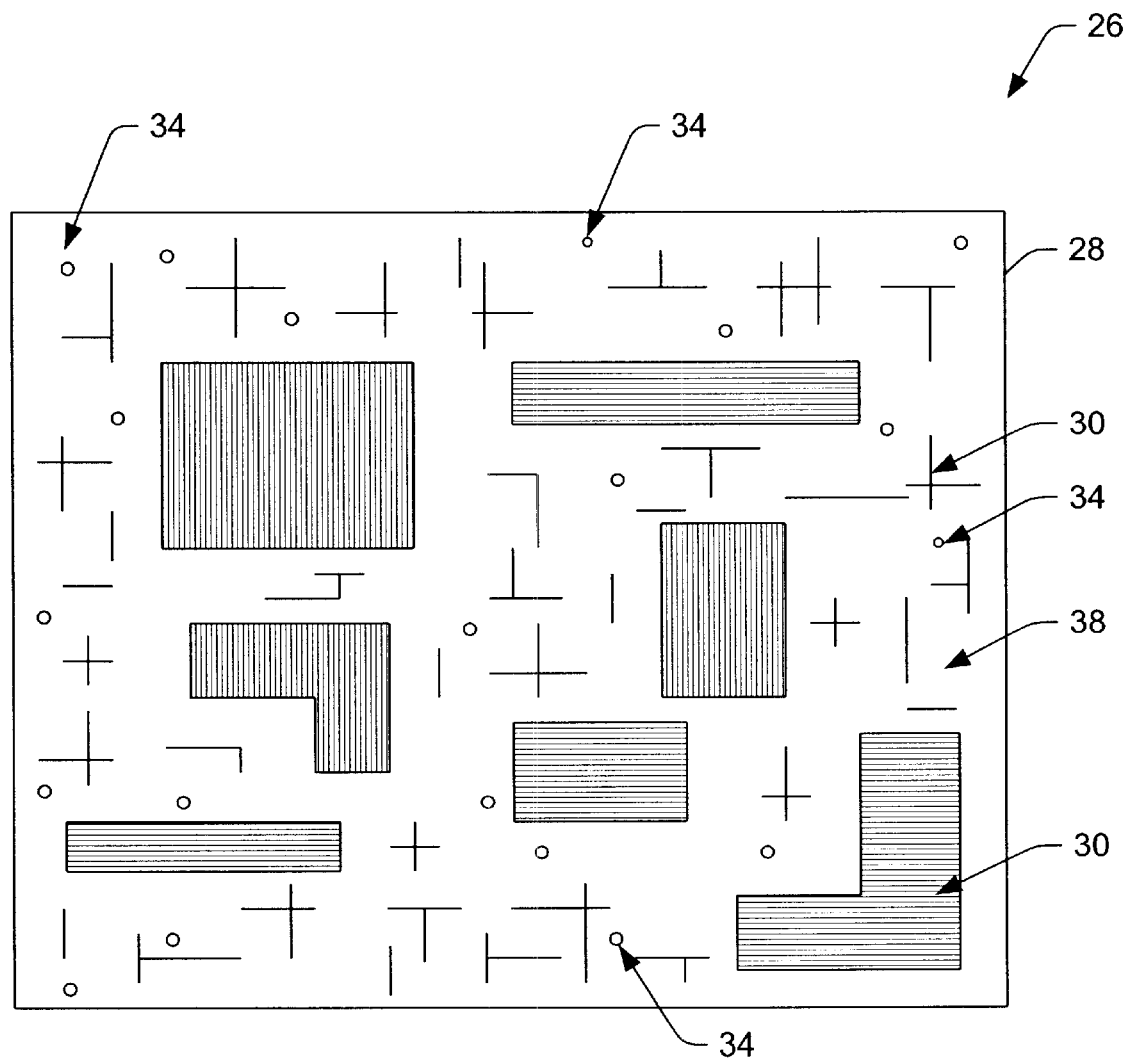
FIG. 2 illustrates a plan view of a photoresist clad wafer patterned by an exemplary mask layout for a logic device demonstrating circular defect distribution on a wafer in accordance with the prior art.

The present invention involves a method and system for reducing post-develop resist residue defects, commonly known as circular or cluster defects, using a dual masking process. One aspect of the present invention more specifically relates to a method and a system using a defect trim mask over image-wise patterned portions of a photoresist and re-exposing uncovered portions of the photoresist with a high dose of energy. As a result of the present invention, the reduction and mitigation of resist residue defects is facilitated. Since post-develop residues are reduced at critical mask layers (e.g., poly gate mask), increased fidelity in pattern imaging is obtainable which leads to improved wafer sort yield and product reliability.

In the present invention, the image-wise patterned portions of the photoresist (unexposed portions of a positive photoresist which result after the photoresist has been irradiated) are masked using a defect trim mask. Subsequently, the photoresist is exposed to a high dose of energy. While not wishing to be bound by any theory, it is believed that due to the unique characteristics of post-develop defects, they are sensitive to high energy levels. That is, post-develop defects are minimized and/or eliminated by a high energy dose of radiation. The high dose of energy may be about two or three times greater than the common energy dose used to pattern the photoresist via a circuit mask. Such high exposure energy doses tend to solubilize the resist residue defects, allowing them to substantially, if not completely, dissolve in a developer solution.

Photomasks generally comprise a patterned chromium layer over a quartz substrate. In the present invention, the defect trim mask comprises a structure substantially similar to that of a conventional photomask. Alternatively, or in addition, the defect trim mask may comprise a dark field layer. The defect trim mask may be designed according to a particular image-wise circuit pattern on the photoresist. In doing so, the defect trim mask substantially, if not completely, covers the circuitry pattern areas.

Upon exposure to a high energy dose, the exposed resist residue defects, comprising impurities with a low solubility rate, become more soluble in the developer solution and thus are able to be effectively removed from the substrate during development. Therefore, reduction of post-develop defects is achieved.

The high dose of energy may be at least two to three times greater than the normal dose of energy used to effect an image-wise pattern in the photoresist (i.e., normal dose for DUV lithography is about 10 mJ to about 25 mJ). In one aspect of the present invention, the high energy dose is from about 20 mJ to about 85 mJ (at least about 20 mJ). In another aspect, the high energy dose is from about 30 mJ to about 75 mJ (at least about 30 mJ). In yet another aspect, the high energy dose is from about 40 mJ to about 65 mJ (at least about 40 mJ).

Alternatively, or in addition, the developer solution used in this high energy exposure process may be a more stringent developer than normally used in patterning a photoresist. For example, the developer may incorporate a more aggressive surfactant, which accomplishes removal of the irradiated defects by reducing the surface tension of the particles in solution and minimizes their tendency to stick to the surface. Water rinse time may also be adjusted together with the developer; however, these adjustments must be balanced with maintaining critical dimension control and product cycle time.

The image-wise circuit pattern is not substantially, if at all, affected by the high dose of radiation because the chromium or dark field layer associated with the defect trim mask shields it from exposure. Therefore, patterning photoresists in accordance with the present invention leads to less pattern deformation in subsequent etch processes.

Figure 3:
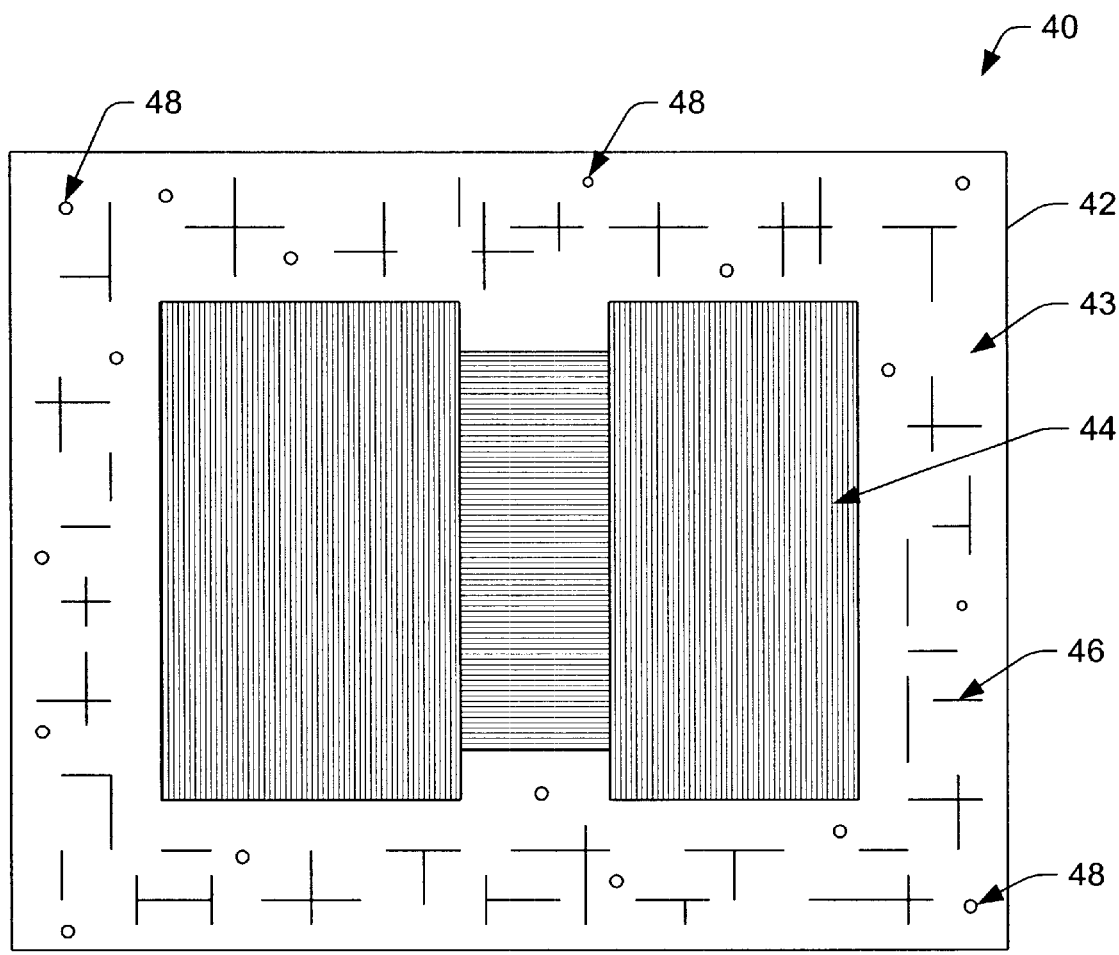
FIG. 3 illustrates a plan view of a photoresist clad semiconductor structure having an exemplary a memory device patterned thereon in accordance with one aspect of the present invention.
Figure 4:
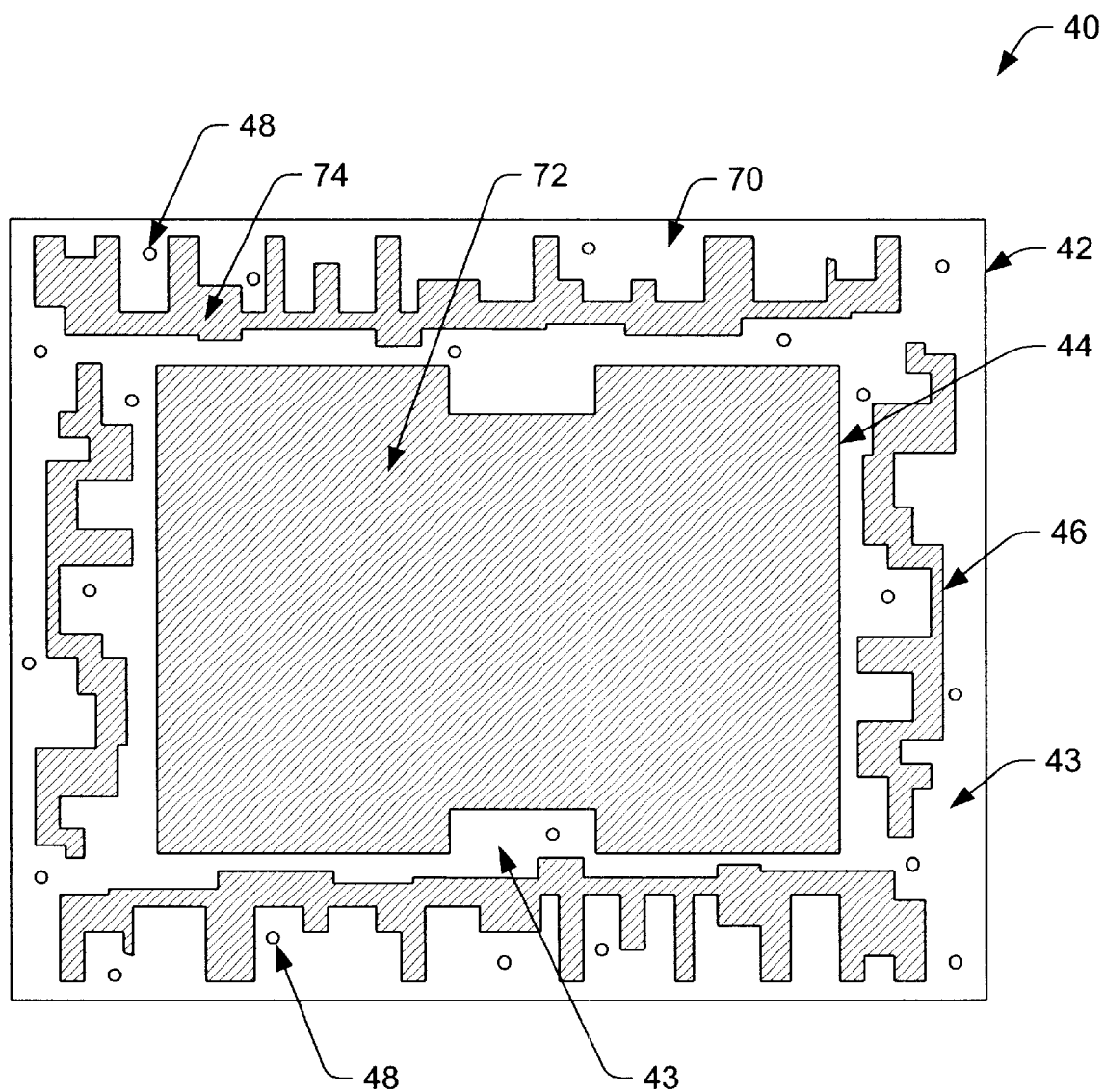
FIG. 4 illustrates a plan view of a masked photoresist clad semiconductor structure in accordance with one aspect of the present invention.
Figure 5:
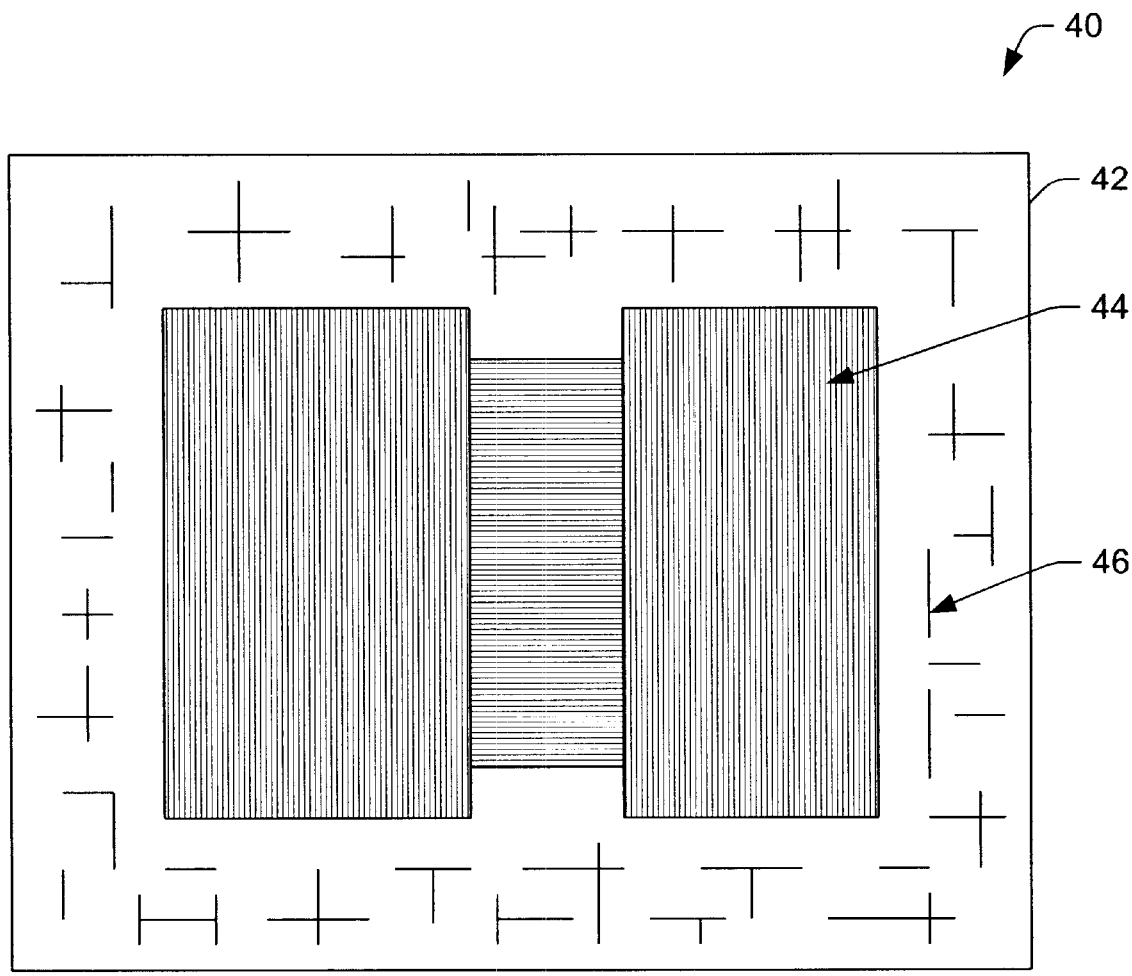
FIG. 5 illustrates a plan view of a photoresist clad semiconductor structure in accordance with another aspect of the present invention.

Referring now to FIGS. 3–5, one aspect of the present invention is shown and described. FIG. 3 illustrates a plan view of a semiconductor structure 40 having a photoresist layer 42 with open areas 43 and circuit areas 44 and 46 thereon. The circuit areas contain image-wise patterns of a core circuit 44 and a peripheral circuit 46, which are both characteristic of a memory device. Resist residues (byproducts) are inherently present on the photoresist as a result of resist processing. As a result of the development process, the resist residues may be transformed into post-develop defects 48. The post-develop defects 48 are commonly observed in the open areas 43 of a developed photoresist.

FIG. 4 illustrates one method for reducing these defects according to one aspect of the present invention. In FIG. 4, the plan view, through a second or defect trim mask 70, of the semiconductor structure 40 for a memory device is illustrated. The structure 40 shows the resist residues 48 primarily present in the open areas 43 of the photoresist 42 after resist processing. In order to reduce the occurrence of post-develop defects in the open areas 43, these areas on the photoresist 42 may be irradiated through the defect trim mask 70 using a high dose of energy.

The defect trim mask 70 may be designed to cover the core 44 and periphery 46 image-wise circuit patterns by, for example, darkening areas 72 and 74 of the trim mask 70, respectively. Irradiating the photoresist 42 through the defect trim mask 70 with the high dose of energy tends to make the resist residues present on the photoresist more, if not completely, soluble in a developer solution. Hence, the presence of resist residues on the image-wise patterned photoresist is reduced, thereby minimizing post-develop defect formation on the photoresist.

FIG. 5 shows the plan view of the structure 40 following exposure to the high dose of energy and development of the photoresist 42. As can be seen, the post-develop defects have been substantially reduced and/or eliminated by irradiating the open areas of the photoresist through the defect trim mask with high levels of radiation (energy). Furthermore, because the image-wise circuit patterns on the photoresist are not exposed to the high levels of energy, they are not substantially affected by them.

Figure 6:
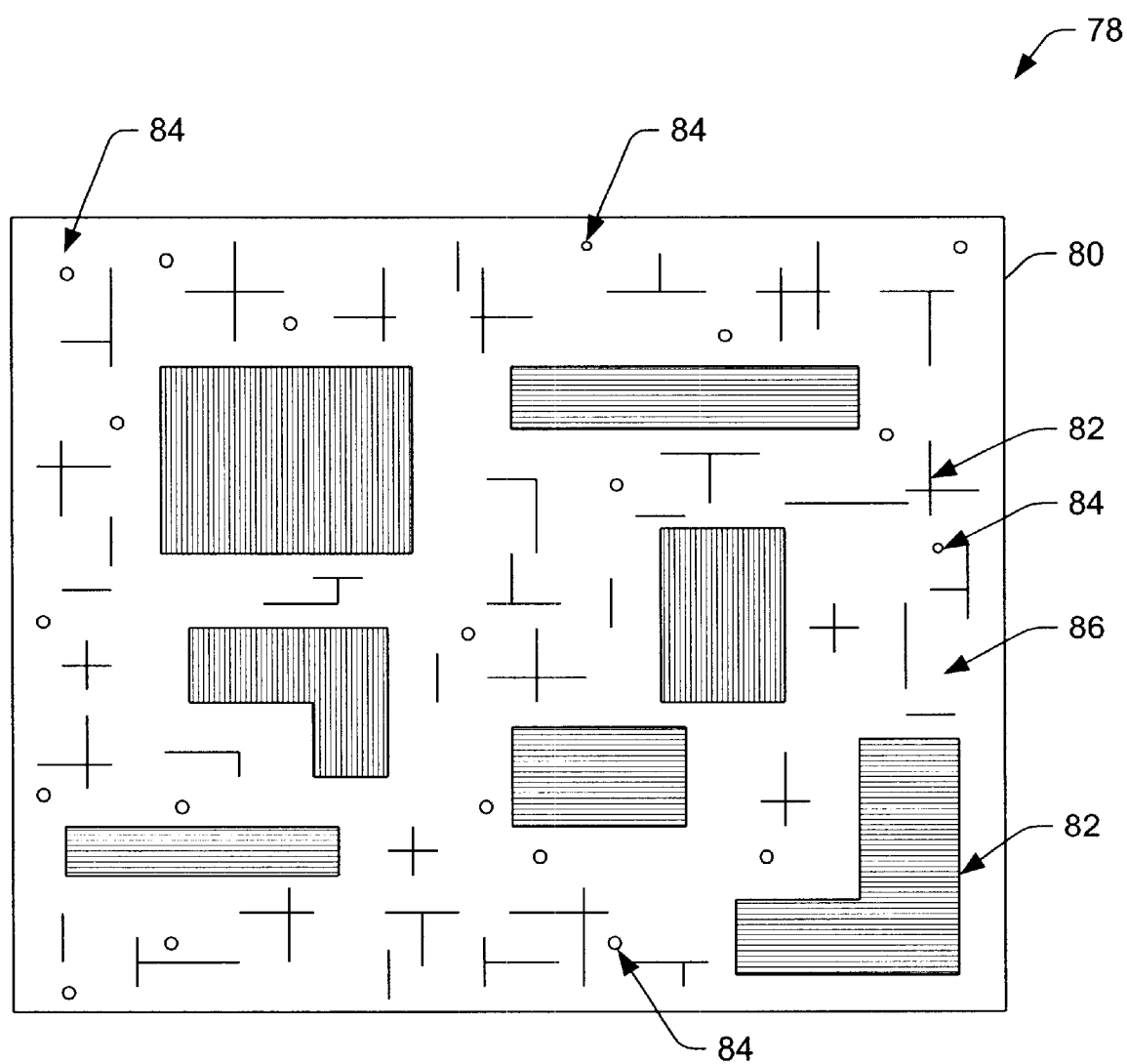
FIG. 6 illustrates a plan view of a photoresist clad semiconductor structure having an exemplary logic device patterned thereon in accordance with another aspect of the present invention.
Figure 7:
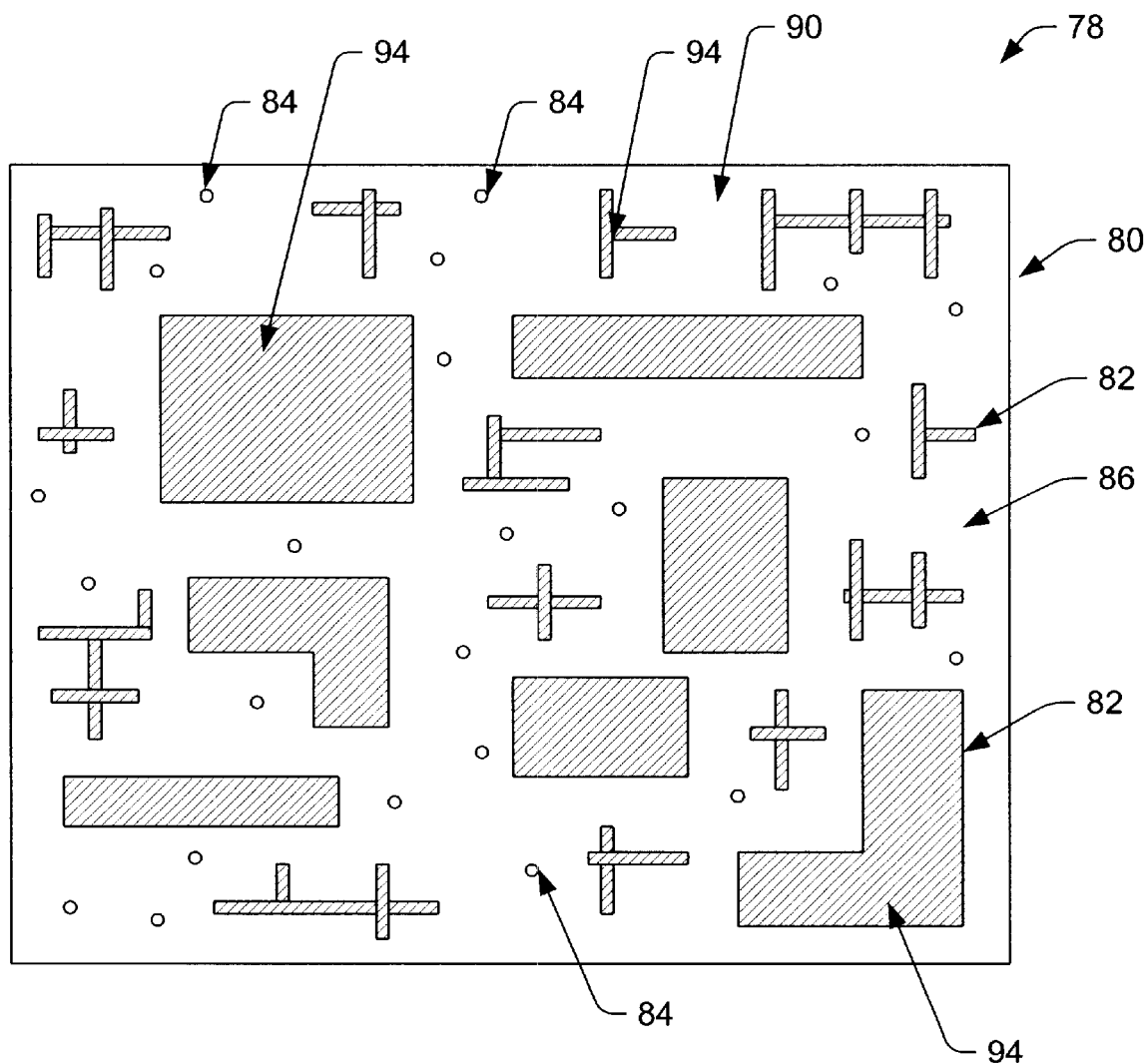
FIG. 7 illustrates a plan view of masked photoresist clad semiconductor structure in accordance with another aspect of the present invention.
Figure 8:
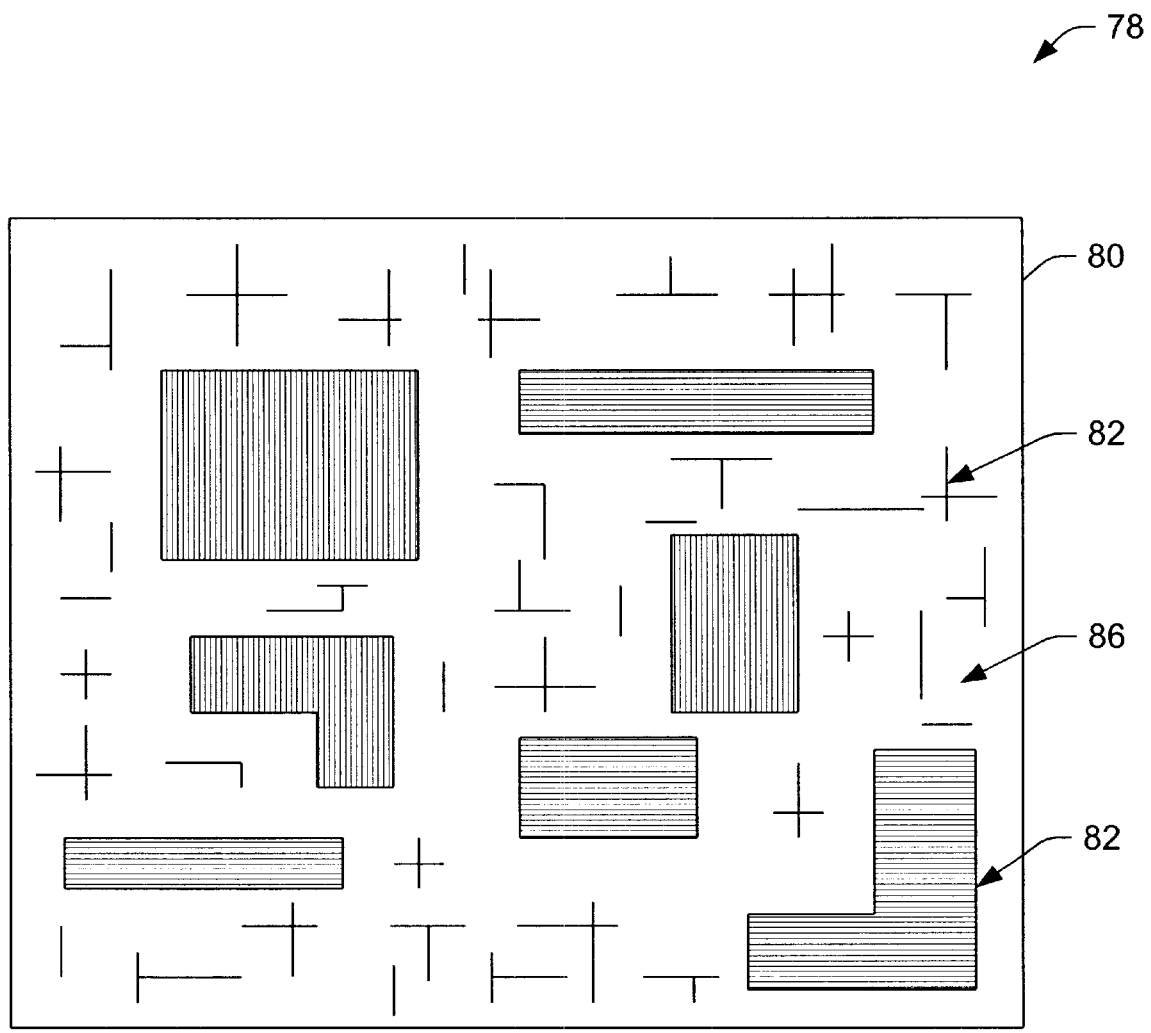
FIG. 8 illustrates a plan view of a photoresist clad semiconductor structure in accordance with another aspect of the present invention.

Referring now to FIGS. 6–8, another aspect of the present invention is shown. FIG. 6 illustrates a plan view of a photoresist clad semiconductor structure 78. The structure 78 comprises a photoresist layer 80 having an image-wise circuit pattern 82 for a logic device thereon. As can be seen in FIG. 6, post-develop defects 84 (resist residue) are primarily interspersed in open areas 86 of the photoresist 80. According to one aspect of the present invention, the photoresist 80 is exposed to a second, higher energy dose of radiation in order to reduce and/or eliminate the defects 84. FIG. 7 illustrates this aspect in accordance with the present invention.

In FIG. 7, the semiconductor structure 78, through a defect trim mask 90, is shown. The structure 78 shows the resist residues 84 primarily present in the open areas 86 of the photoresist 80 after resist processing. In order to reduce the occurrence of post-develop defects in the open areas 86, these areas may be irradiated through the defect trim mask 90 using a high dose of energy. The defect trim mask 90 may be designed to cover or shield the image-wise patterned areas 82 (image-wise circuit pattern) of the photoresist 80 by, for example, darkening areas 94 of the trim mask 90.

The image-wise patterned areas 82 of the photoresist 80 are not substantially, if at all, exposed to the high energy dose due to the defect trim mask 90 (i.e., darkened areas 94 of the trim mask 90). However, since the darkened areas 94 of the trim mask 90 do not substantially shield the resist residues 84, they remain exposed to the high energy levels. The high dose of energy causes the residues 84 to become more, if not completely, soluble in a developer solution. Thus, they are easily removed by the developer solution, thereby reducing the post-develop defects present on the photoresist 80 and ultimately on the semiconductor structure 78.

FIG. 8 illustrates the substantial reduction and/or elimination of the post-develop defects 84 on the photoresist 80. As can be seen, the second masking and irradiation process (i.e., defect trim mask) facilitates improved image transfer fidelity during subsequent etch processes.

Figure 9:
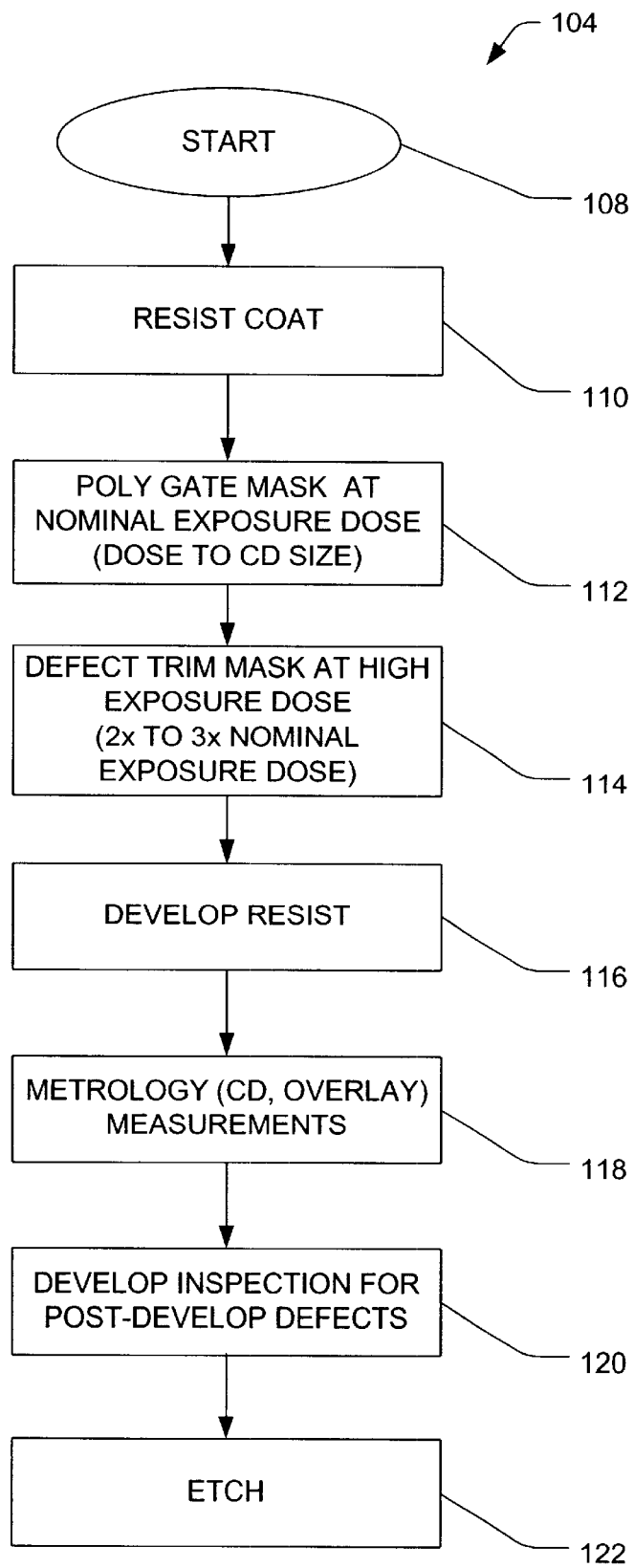
FIG. 9 illustrates an exemplary lithography process flow in accordance with another aspect of the present invention.

Turning now to FIG. 9, an exemplary process 104 in accordance with one aspect of the present invention is shown. The process 104 comprises preparatory actions 108 not described here for the sake of brevity. Once a semiconductor structure has been prepared for processing, the process 104 begins 108 at 110, wherein a photoresist is coated or deposited onto the structure. The photoresist may be applied using a technique suitable to carry out the present invention such as, for example, spin-coating. After the photoresist solidifies, a photomask such as a poly gate or circuit mask is deposited over the photoresist. It should be understood that the mask may be any photomask suitable to carry out the present invention and is not limited to the poly gate or circuit mask.

At 112, the poly gate mask is exposed to a suitable source and level of energy in order to effect an image-wise pattern transfer in the photoresist. A suitable energy exposure dose is from about 10 mJ to about 25 mJ, for example. However, it should be understood that any dose of energy suitable to effect an image-wise pattern transfer in the photoresist may be employed to carry out the present invention.

In 114, the image-wise circuit pattern areas are covered by a defect trim mask, leaving the open areas (i.e., areas having no image-wise circuit pattern thereon) exposed. The open areas are then irradiated (through the defect trim mask) with a high dose of energy. The high dose of energy may be at least two to three times greater than the normal dose of energy used to effect an image-wise pattern in the photoresist (e.g., a normal dose for DUV lithography is from about 10 mJ to about 25 mJ). For example, a high dose of energy may be from about 15 mJ to about 100 mJ (at least about 15 mJ); from about 20 mJ to about 85 mJ (at least about 20 mJ); from about 30 mJ to about 75 mJ (at least about 30 mJ); and/or from about 40 mJ to about 65 mJ (at least about 40 mJ).

Irradiating the resist residue defects with the high dose of energy causes them to become more, if not completely, soluble in a developer solution (at 116). Alternatively, or in addition, the developer solution may be adjusted to comprise a more aggressive surfactant which serves to reduce the surface tension of particles in solution and to minimize their tendency to stick to the surface. Furthermore, water rinse time may also be adjusted to increase the dissolution and reduction of the defects. However, it should be appreciated that increasing the developer and water rinse time must be balanced with other factors such as critical dimension control and product cycle time.

Following the development process, metrology measurements of the photoresist are taken at 118. Metrology measurements include critical dimensions and overlay. At 120, a develop inspection for post-develop defects is performed. The present invention facilitates a reduction of post-develop defects observed at this stage in the lithography process. Following the develop inspection, the photoresist clad semiconductor structure proceeds to etch processing (at 122).

According to the present invention as described herein, reducing and/or eliminating the presence of resist residues on the photoresist during the development process facilitates the reduction and/or elimination of post-develop defects.

It should be appreciated that the present invention may be combined with or further contain additional processing in accordance with a desired lithography process. Therefore, the scope of the present invention is not limited by the processing as described herein.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for reducing resist residue defects comprising:
    providing a semiconductor structure having a photoresist, the photoresist comprising open areas and circuit areas thereon;
    irradiating the open areas and circuit areas through a first patterned photomask with a first energy dose to effect an image-wise pattern in the photoresist;
    irradiating the open areas of the photoresist through a second patterned photomask with a second energy dose wherein the circuit areas are masked from irradiation, wherein the second energy dose is greater than the first energy dose; and
    developing the photoresist.

2. The method of claim 1, wherein the first photomask is a poly gate mask.

3. The method of claim 1, wherein the second photomask is a defect trim mask.

4. The method of claim 1, wherein the first energy dose is from about 10 mJ to about 25 mJ.

5. The method of claim 1, wherein the second energy dose is at least about two times greater than the first energy dose.

6. The method of claim 1, wherein the second energy dose is from about 15 mJ to about 100 mJ.

7. The method of claim 1, wherein the second energy dose is from about 20 mJ to about 85 mJ.

8. The method of claim 1, further comprising:
    inspecting the wafer structure for the resist residue defects after development of the photoresist; and
    etching the wafer structure using the developed photoresist as an etch mask.

9. The method of claim 1, wherein the semiconductor structure is a memory device.

10. The method of claim 1, wherein the semiconductor structure is a logic device.

11. A method for reducing resist residue defects comprising:
    providing a semiconductor structure having a photoresist, the photoresist comprising open areas and circuit areas thereon;
    irradiating the open areas and the circuit areas of the photoresist through a patterned photomask with a first energy dose to effect an image-wise pattern in the photoresist;
    irradiating the open areas of the photoresist through a patterned defect trim mask with a second energy dose, wherein the circuit areas are masked from irradiation, and the second energy dose is greater than the first energy dose; and
    developing the photoresist.

12. The method of claim 11, wherein the photomask is a poly gate mask.

13. The method of claim 11, wherein the first energy dose is from about 10 mJ to about 25 mJ.

14. The method of claim 11, wherein the second energy dose is at least about two times greater than the first energy dose.

15. The method of claim 11, wherein the second energy dose is from about 30 mJ to about 75 mJ.

16. The method of claim 11, further comprising:
    inspecting the wafer structure for the resist residue defects after development of the photoresist; and
    etching the wafer structure using the developed photoresist as an etch mask.

17. The method of claim 11, wherein the semiconductor structure is at least one of a memory device and a logic device.

18. A method for reducing resist residue defects in open areas peripheral to an image-wise circuit pattern on a photoresist clad semiconductor structure comprising:

depositing a photoresist layer having open areas and circuit areas over the semiconductor structure;

irradiating the open areas and the circuit areas of the photoresist through a poly gate mask with a first energy dose to effect an image-wise pattern in the photoresist;

irradiating the open areas of the photoresist through a patterned defect trim mask with a second energy dose, wherein the second energy dose is greater than the first energy dose, and wherein the circuit areas are masked from irradiation, and the second energy dose is at least about two times greater than the first energy dose; and developing the photoresist.

19. The method of claim 18, wherein the first energy dose is from about 10 mJ to about 25 mJ.

20. The method of claim 18, wherein the second energy dose is from about 40 mJ to about 65 mJ.

21. The method of claim 18, further comprising:

inspecting the wafer structure for the resist residue defects after development of the photoresist; and etching the wafer structure using the developed photoresist as an etch mask.

22. The method of claim 18, wherein the semiconductor structure is at least one of a memory device and a logic device.

\* \* \* \* \*